US009502118B2

(12) United States Patent
Siciliani et al.

(10) Patent No.: US 9,502,118 B2
(45) Date of Patent: Nov. 22, 2016

(54) NAND MEMORY ADDRESSING

(71) Applicant: Intel Corporation, Santa Clara, CA (US)

(72) Inventors: Umberto Siciliani, Rubano (IT); Tommaso Vali, Sezze (IT); Terry Grunzke, Boise, ID (US); Ali Mohammadzadeh, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/498,084

(22) Filed: Sep. 26, 2014

(65) Prior Publication Data

US 2016/0093379 A1   Mar. 31, 2016

(51) Int. Cl.
| | |
|---|---|
| *G11C 16/08* | (2006.01) |
| *G11C 16/04* | (2006.01) |
| *G11C 5/06* | (2006.01) |
| *G11C 7/10* | (2006.01) |
| *G11C 16/32* | (2006.01) |
| *G11C 11/56* | (2006.01) |
| *G11C 27/02* | (2006.01) |

(52) U.S. Cl.
CPC ............... *G11C 16/08* (2013.01); *G11C 5/066* (2013.01); *G11C 7/1045* (2013.01); *G11C 11/5621* (2013.01); *G11C 16/0483* (2013.01); *G11C 16/32* (2013.01); *G11C 27/02* (2013.01); *G11C 2211/5641* (2013.01)

(58) Field of Classification Search
CPC ............................ G11C 16/0483; G11C 16/08
USPC .................... 365/185.17, 189.14, 185.12
See application file for complete search history.

(56) References Cited

U.S. PATENT DOCUMENTS

| | | | | |
|---|---|---|---|---|
| 2006/0075395 | A1* | 4/2006 | Lee | G11C 16/102 717/168 |
| 2006/0195650 | A1* | 8/2006 | Su | G11C 16/20 711/103 |
| 2008/0266991 | A1* | 10/2008 | Lee | G06F 11/1044 365/203 |
| 2011/0060869 | A1* | 3/2011 | Schuette | G06F 3/0626 711/103 |
| 2012/0110241 | A1* | 5/2012 | Lam | G11C 16/20 711/103 |
| 2013/0262744 | A1* | 10/2013 | Ramachandra | G11C 5/066 711/103 |

* cited by examiner

*Primary Examiner* — Hoai V Ho
*Assistant Examiner* — Jay Radke
(74) *Attorney, Agent, or Firm* — Thorpe North & Western, LLP

(57) ABSTRACT

Technology for performing addressing in a NAND memory is described. A defined number of address cycles supported at either a memory controller or a NAND memory to address individual memory units in the NAND memory can be identified. The defined number of address cycles in which to operate can be selected in order to address the individual memory units in the NAND memory. Either the memory controller or the NAND memory can be configured to operate at the selected number of address cycles where the individual memory units in the NAND memory are uniquely addressable using a multi die select (MDS).

19 Claims, 8 Drawing Sheets

| Number of Die | | CE# | MDS3 | MDS2 | MDS1 | MDS0 | Address Enable |
|---|---|---|---|---|---|---|---|
| Single | Die0 | CE# | 1 | 1 | 1 | 1 | - |
| Dual_A | Die0 | CE# | 1 | 1 | 1 | 1 | - |
| | Die1 | CE2# | 1 | 1 | 1 | 1 | - |
| Dual_B | Die0 | CE# | 1 | 0 | 1 | 1 | LA0=0 |
| | Die1 | CE# | 1 | 0 | 1 | 0 | LA0=1 |
| Quad_A | Die0 | CE# | 1 | 0 | 1 | 1 | LA0=0 |
| | Die1 | CE# | 1 | 0 | 1 | 0 | LA0=1 |
| | Die2 | CE2# | 1 | 0 | 1 | 1 | LA0=0 |
| | Die3 | CE2# | 1 | 0 | 1 | 0 | LA0=1 |
| Quad_B | Die0 | CE# | 1 | 1 | 0 | 1 | LA1=0 LA0=0 |
| | Die1 | CE# | 1 | 1 | 0 | 0 | LA1=0 LA0=1 |
| | Die2 | CE# | 1 | 0 | 0 | 1 | LA1=1 LA0=0 |
| | Die3 | CE# | 1 | 0 | 0 | 0 | LA1=1 LA0=1 |

FIG. 3

| Number of Die | | CE# | MDS3 | MDS2 | MDS1 | MDS0 | Address Enable |
|---|---|---|---|---|---|---|---|
| Eight_A | Die0 | CE# | 0 | 0 | 0 | 0 | LA2=0 LA1=0 LA0=0 |
| | Die1 | CE# | 0 | 0 | 0 | 1 | LA2=0 LA1=0 LA0=1 |
| | Die2 | CE# | 0 | 0 | 1 | 0 | LA2=0 LA1=1 LA0=0 |
| | Die3 | CE# | 0 | 0 | 1 | 1 | LA2=0 LA1=1 LA0=0 |
| | Die4 | CE# | 0 | 1 | 0 | 0 | LA2=1 LA1=0 LA0=0 |
| | Die5 | CE# | 0 | 1 | 0 | 1 | LA2=1 LA1=0 LA0=1 |
| | Die6 | CE# | 0 | 1 | 1 | 0 | LA2=1 LA1=1 LA0=0 |
| | Die7 | CE# | 0 | 1 | 1 | 1 | LA2=1 LA1=1 LA0=1 |
| Eight_B | Die0 | CE# | 1 | 1 | 0 | 1 | LA1=0 LA0=0 |
| | Die1 | CE# | 1 | 1 | 0 | 0 | LA1=0 LA0=1 |
| | Die2 | CE# | 1 | 0 | 0 | 1 | LA1=1 LA0=0 |
| | Die3 | CE# | 1 | 0 | 0 | 0 | LA1=1 LA0=1 |
| | Die4 | CE2# | 1 | 1 | 0 | 1 | LA1=0 LA0=0 |
| | Die5 | CE2# | 1 | 1 | 0 | 0 | LA1=0 LA0=1 |
| | Die6 | CE2# | 1 | 0 | 0 | 1 | LA1=1 LA0=0 |
| | Die7 | CE2# | 1 | 0 | 0 | 0 | LA1=1 LA0=1 |

FIG. 4

NAND MEMORY ADDRESSING

TECHNICAL FIELD

Embodiments described herein relate generally to NAND memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage node (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand. These expanded uses, in concert with the growing size of data generated or required by many operations, continue to increase the demand for large memory size.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 3 is a table illustrating multi die select (MDS) mapping values for up to four memory units per chip enable within a NAND memory in accordance with an example embodiment;

FIG. 4 is a table illustrating multi die select (MDS) mapping values for up to eight memory units per chip enable within a NAND memory in accordance with an example embodiment;

Figure 1:
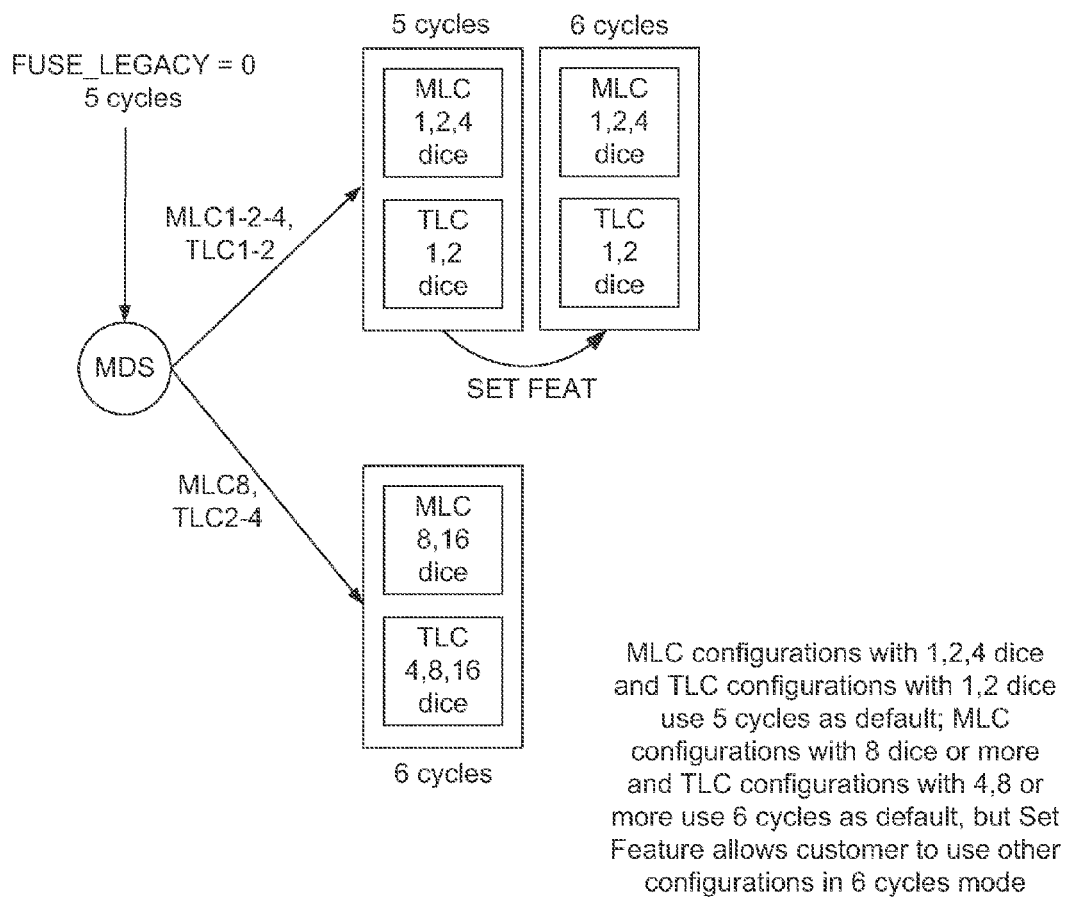
FIG. 1 is a diagram illustrating a defined number of address cycles used to address individual memory units within a NAND memory based on a multilevel cell (MLC) configuration of the NAND memory in accordance with an example embodiment.

Reference will now be made to the exemplary embodiments illustrated, and specific language will be used herein to describe the same. It will nevertheless be understood that no limitation of the scope of this disclosure is thereby intended.

DETAILED DESCRIPTION

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various invention embodiments. One skilled in the relevant art will recognize, however, that such detailed embodiments do not limit the overall inventive concepts articulated herein, but are merely representative thereof.

As used in this specification and the appended claims, the singular forms "a," "an" and "the" include plural referents unless the context clearly dictates otherwise. Thus, for example, reference to "a bit line" includes a plurality of such bit lines.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations are not shown or described in detail to avoid obscuring aspects of the disclosure.

In this specification, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

Example Embodiments

An initial overview of technology embodiments is provided below and then specific technology embodiments are described in further detail later. This initial summary is intended to aid readers in understanding the technology more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In general, flash memories can use one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, it is desirable that the parts count be minimized in order to continue to reduce the costs of the system. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a data state, e.g., a bit pattern, to a specific threshold voltage (Vt) range of the cell. Multilevel levels can permit the storage of two or more bits of information per cell, depending on the quantity of voltage ranges assigned to the cell and the stability of the assigned voltage ranges during the lifetime operation of the memory cell.

A technology is described for accessing individual memory units in a NAND memory. The memory units can be accessed via a particular address associated with each of the memory units. The memory units in the NAND memory can also be referred to as dies or logical unit number (LUNs). The terms "dies" and "LUNs" can be used interchangeably herein. The memory units can be addressed in the NAND memory in order to perform a read operation, a write operation or an erase operation with respect to the memory units. The memory controller can use a defined number of address cycles to address a particular column, page, block, plane and logical unit number (LUN) in the NAND memory. Each address cycle can provide eight bits, and therefore, the memory controller can use up to 40 bits (e.g., five address cycles) or up to 48 bits (e.g., six address cycles) to address the individual memory units in the NAND memory.

In one example, a memory controller can use a defined number of address cycles to address the individual memory units in the NAND memory (e.g., five address cycles in a legacy mode or six address cycles). In other words, in specific embodiments, the memory controller is capable of supporting five or six address cycles. In other embodiments, other numbers of address cycles may be used as required depending on the logic of the controller and/or the NAND memory device. The memory controller can configure the NAND memory to operate at a selected number of address cycles, wherein the selected number of address cycles corresponds with a capability of the NAND memory. In one configuration, the NAND memory can be capable of switching from five address cycles to six address cycles, via the switching element in the NAND memory (e.g., a fuse), when the defined number of address cycles supported at the memory controller is six address cycles. In another example, the NAND memory can be capable of switching from six address cycles to five address cycles, via the switching element, when the defined number of address cycles supported at the memory controller is five address cycles. As further elaborate herein, in some embodiments, the memory controller can switch its level of address cycles to accommodate the number of cycles in the NAND memory.

In one configuration, the NAND memory can be configured to support a memory controller that operates using a fixed number of address cycles (e.g., 5 or 6 address cycles). For example, the NAND memory may operate in a default mode of six address cycles, but certain configurations of the NAND memory (e.g., configurations that vary based on a density of the NAND memory) may support five address cycles. In this case, the NAND memory can be defaulted to using six address cycles, but a legacy memory controller (e.g., a memory controller that only supports five address cycles) can be used with the NAND memory if the memory controller overwrites a switching device or element, for example, a fuse, on the NAND memory, thereby switching the NAND memory from six address cycles to five address cycles. Therefore, the NAND memory can maintain backwards compatibility with memory controllers that operate in a legacy mode (i.e., five address cycles). This principle in operation and configuration also applies if the number of address cycles in the memory controller is greater than the number of address cycles that is preset in the NAND memory device. For example, the memory controller supports six address cycles and the NAND memory device configured to support either five or six address cycles, but defaulted (i.e. contains logic) to five. In such case, via the switching element or device, the memory controller can re-configure the NAND memory to operate in six address cycles.

In one example, the memory controller can select the defined number of address cycles based on the density of the NAND memory. For example, if the density of the NAND memory exceeds a defined threshold, the memory controller can use six address cycles to address the individual memory units in the NAND memory. The density of the NAND memory can refer to a number of memory units per stack (or per chip enable) in the NAND memory. In addition, the density can refer to whether the NAND memory supports single bit per cell (SLC), two bits per cell (MLC), or three bits per cell (TLC). The memory controller can use a default number of address cycles (e.g., 5 address cycles) to address the individual memory units in the NAND memory when the density of the NAND memory does not exceed the defined threshold. Depending on the density of the NAND memory, the memory controller can switch between using five address cycles and using six address cycles (via the switching element in the NAND memory) for addressing the memory units in the NAND memory. In other words, the memory controller can overwrite a switching element or device (i.e. a fuse) in the NAND memory in order to switch between five address cycles and six address cycles, or vice versa.

In one configuration, the individual memory units can be addressed in the NAND memory using a multi die select (MDS), wherein each individual memory unit (e.g., each LUN) is addressable using a unique address that is generated based on a number of chip enables in the NAND memory and a number of memory units per chip enable.

In general, individual memory units within the NAND memory (e.g., dies or LUNs in the NAND memory) can be addressed in order to perform read, write or erase operations. For example, during the write operation, values can be written to the memory units in the NAND memory. A memory controller (or an external controller) can access the individual memory units in the NAND memory (via addressing) in order to perform the read, write and erase operations. Alternatively, a set of memory units that are together in a package within the NAND memory (e.g., a package comprising 8 LUNs) can be addressed in order to perform the read, write or erase operations. Thus, the read, write or erase operations can be performed with respect to a plurality (or an array) of memory units in the NAND memory. In other words, the memory controller can address the plurality of memory units in the NAND memory (e.g., an entire page on a block) at a given time. In addition to performing the addressing, the memory controller can send a number of control signals to the NAND memory, such as a chip enable CE#, a command latch enable CLE, an address latch enable ALE, and a write enable WE# when performing memory-related operations.

A standard convention can be used when addressing the NAND memory. For example, a defined number of bits can be used to access the individual memory units (or rows and columns of individual memory units) in the NAND memory. In particular, the bits can be used to access a defined number of columns, pages, blocks and LUNs within the NAND memory. As a non-limiting example, a NAND memory can include 16,000 columns, 1000 pages, 2000 blocks, and 2 LUNs. The bits can be used to address each particular memory unit within the NAND memory, i.e., each individual memory unit in the NAND memory is addressable and has a certain associated address. An address cycle can include 8 bits (or one byte) and multiple address cycles can be used to address the NAND memory. The address cycles can define which column, which page, which block and which LUN is to be used to perform read, write or erase operations. In other words, the five address cycles can be used for addressing a particular memory location within the NAND memory. Upon addressing the memory units via the multiple address cycles, the memory controller can transmit a command to the NAND memory to direct the NAND memory to begin a particular operation.

As the density of NAND memory increases, the number of columns, pages, blocks and/or LUNs in a NAND memory device can also increase. In other words, a greater number of bits are to be used for addressing all of the memory units within the NAND memory. As a non-limiting example, rather than using two bytes (i.e., 16 bits) to address the columns, 18 bits can be used to address an increased number of columns in the NAND memory. In addition, 10 bits can be used to address an increased number of pages in the NAND memory, and 18 bits can be used to address an increased number of blocks and LUNs in the NAND memory. The number of bits (46 bits in this example) for addressing the memory units in the NAND memory can exceed five address cycles and push into a sixth address cycle. Therefore, in some situations, six address cycles (or up to 48 bits) can be used to address the increased number of columns, pages, blocks and/or LUNs in NAND memories with increased density. The density of the NAND memory can refer to a number of memory units per stack in the NAND memory (e.g., 2 LUNs per stack or package) and whether the NAND memory supports single bit per cell (SLC), two bits per cell (MLC), or three bits per cell (TLC). Multiple LUNs (or dies) can be stacked together in a package within the NAND memory. In addition, NAND memory can use multiple levels per cell so that additional bits can be stored using a same number of transistors. In general, a greater number of bits are used to address NAND memories with TLC, as opposed to NAND memories with SLC or MLC.

In one example, six address cycles can be used to address NAND memories that are larger than 256 gigabits (Gb). In another example, the memory controller can use the six address cycles when the number of LUNs increases from two LUNs to 8 LUNs within a same package or chip enable in the NAND memory, i.e., when the density of the NAND memory increases. In yet another example, the memory controller can use the six address cycles when the NAND memory uses TLC and has 8 LUNs within the same chip enable or package in the NAND memory.

In one example, the memory controller can perform an intelligent decision on the number of address cycles to use based on the density of the NAND memory. For example, if the density of the NAND memory is below a defined threshold, then the memory controller can determine to use five address cycles when performing the addressing. If the density of the NAND memory is above the defined threshold, then the memory controller can determine to use six address cycles when performing the addressing. As a non-limiting example, the density can be above the defined threshold when the NAND memory uses TLC and has 8 LUNs within the same chip enable in the NAND memory. In addition, the memory controller can use six cycles as a default mode, but if the density of the NAND memory being addressed is below the defined threshold, the memory controller can switch to using five cycles. Alternatively, the memory controller can use five cycles as a default mode, and if necessary, the memory controller can switch to using six cycles. The memory controller can detect the number of LUNs (or dies) per chip enable or package and a mode that the NAND memory is operating at (e.g., SLC, MLC, or TLC), and then determine whether to use five address cycles or six address cycles to perform the addressing.

In one example, the NAND memory can have a switching element or device, such as a fuse that, when powered, automatically causes the NAND memory to start in a default mode of five address cycles or six address cycles. Although the fuse can cause the NAND memory to start at five address cycles, the memory controller can overwrite the fuse in order to switch the NAND memory from operating in five address cycles to operating in six address cycles. Alternatively, the fuse can cause the NAND memory to start at six address cycles, but the memory controller can overwrite the fuse in order to switch the NAND memory from operating in six address cycles to operating in five address cycles. Therefore, the NAND memory can be configured to support a capability of the memory controller. For example, the NAND memory can be configured to operate in six address cycles when the memory controller is capable of only operating in six address cycles. Alternatively, the NAND memory (which operates using six address cycles as default) can be reconfigured to operate in five address cycles when the memory controller is capable of only operating in five address cycles.

In one configuration, the individual memory units in the NAND memory can be addressed using a multi die select (MDS). Each individual memory unit can be addressable using a unique address that is associated with the individual memory unit. The unique address can be generated based on a number of memory units per chip enable and/or package (i.e., number of LUNs per chip enable and/or package) in the NAND memory. For example, MDS can refer to a specific technique for addressing the different LUNs in a package within the NAND memory. An exemplary package in the NAND memory can include two or four or eight or sixteen LUNs (or dies), and each of the two or four or eight or sixteen LUNs have their own unique addressing. Therefore, the memory controller can address particular LUNs in a package within the NAND memory by using a unique address associated with each of the LUNs in order to perform various operations (e.g., read, write, or erase).

As previously discussed, the address cycles can include a certain number of bits for addressing the LUNs. Based on the configuration of the MDS, the LUNs can be given unique addressability within a target (i.e., a chip enable) in the NAND memory. If the target (i.e., the chip enable) in the NAND memory has one LUN, there is no LUN addressability. When the NAND memory has four LUNs per target (i.e. chip enable), two bits can be used (as part of the five or six address cycles) to address one of the four LUNs. When the NAND memory has eight LUNs per target (i.e. chip enable), three bits can be used (as part of the five or six address cycles) to address one of the eight LUNs. When the NAND memory has sixteen LUNs per target (i.e. chip enable), four bits can be used (as part of the five or six address cycles) to address one of the sixteen LUNs.

In one example, the NAND memory can have several LUNs per chip enable within a package. The chip enable can be a chip select, i.e., a technique for selecting particular LUN(s) so that the LUN(s) are ready to accept commands from the memory controller. There can be several chip enables per package in the NAND memory. The memory controller can access a target (i.e., a chip enable) in the NAND memory, and within that target, there can be several addressable LUNs.

In one example, the MDS and the chip enable can be input to the NAND memory. In other words, these are input signals to the NAND memory that are communicated from an external controller, such as the memory controller. The chip enable can be used to communicate with the different LUNs in the NAND memory. The memory controller can use the chip enable to enable a certain LUN or die in the NAND memory. If every LUN or die in the NAND memory has its own chip enable input (e.g., a dedicated signal), then MDS may not be used because each LUN or die has its own chip enable, and the memory controller that enables that chip enable can make that particular LUN or die active. In this example, there can be no need to distinguish between different LUNs or dies in a stack of LUNs or dies. However, it can be costly to have chip enables for each LUN. Therefore, chip enables can be shared between multiple LUNs. If one chip enable that enables the LUN is shared between four LUNs, the MDS can be used to define which LUN is to be accessed by the memory controller. Therefore, in a package with four LUNs, the MDS can define a first LUN as die0, a second LUN as die1, a third LUN as die2 and a fourth LUN as die3. The memory controller, even if the LUNs share the same chip enable, can use the address cycles included in program and read commands to address each LUN individually and to program and/or read independently. Each LUN that is sharing a chip enable in the package can have an associated binary code (e.g., a LUN address) that provides unique addressability within that target (i.e., the chip enable). The address can vary depending on whether the package has one chip enable or multiple chip enables.

In one example, there can be four MDS pads for each LUN in the package. There can be a ground plane and a power plane in the package. Each one of the four paths can be bonded to either ground or Vcc (either 0 or 1). In other words, if an MDS value is 0, then the path for that LUN is grounded and if the MDS value is 1, then the path for that LUN is tied to Vcc. Based on the four MDS paths that are set, the binary code can be assigned to each LUN in the package, thereby providing the LUN with unique addressability.

FIG. 1 is an exemplary diagram illustrating a default number of address cycles used to address individual memory units within a NAND memory based on a multilevel cell (MLC) configuration of the NAND memory. The memory units in the NAND memory can also be referred to as dies or logical unit number (LUNs). The terms "dies" and "LUNs" can be used interchangeably herein. A memory controller can operate in a legacy mode (i.e., five address cycles) as default when the NAND memory is operating according to the MLC configuration and one, two or four LUNs are included per chip enable in the NAND memory. In addition, the memory controller can operate in the legacy mode (i.e., five address cycles) as default when the NAND memory is operating according to a three bits per cell (TLC) configuration and one or two LUNs are included per chip enable in the NAND memory.

In one example, the memory controller can operate using six address cycles. The NAND memory can be reconfigured (via a fuse on the NAND memory) to support the six address cycles that are used at the memory controller. Therefore, the memory controller can use six cycles when the NAND memory is operating according to the MLC configuration and one, two or four LUNs are included per chip enable in the NAND memory. In addition, the memory controller can use six cycles when the NAND memory is operating according to the TLC configuration and one or two LUNs are included per chip enable in the NAND memory.

In one example, the memory controller can operate in a six address cycle mode as default when the NAND memory is operating according to the MLC configuration and at least eight LUNs (e.g., 8 or 16 LUNs) are included per chip enable in the NAND memory. In addition, the memory controller can operate in the six cycle mode as default when the NAND memory is operating according to the TLC configuration and four, eight or sixteen LUNs are included per chip enable in the NAND memory.

Figure 2:
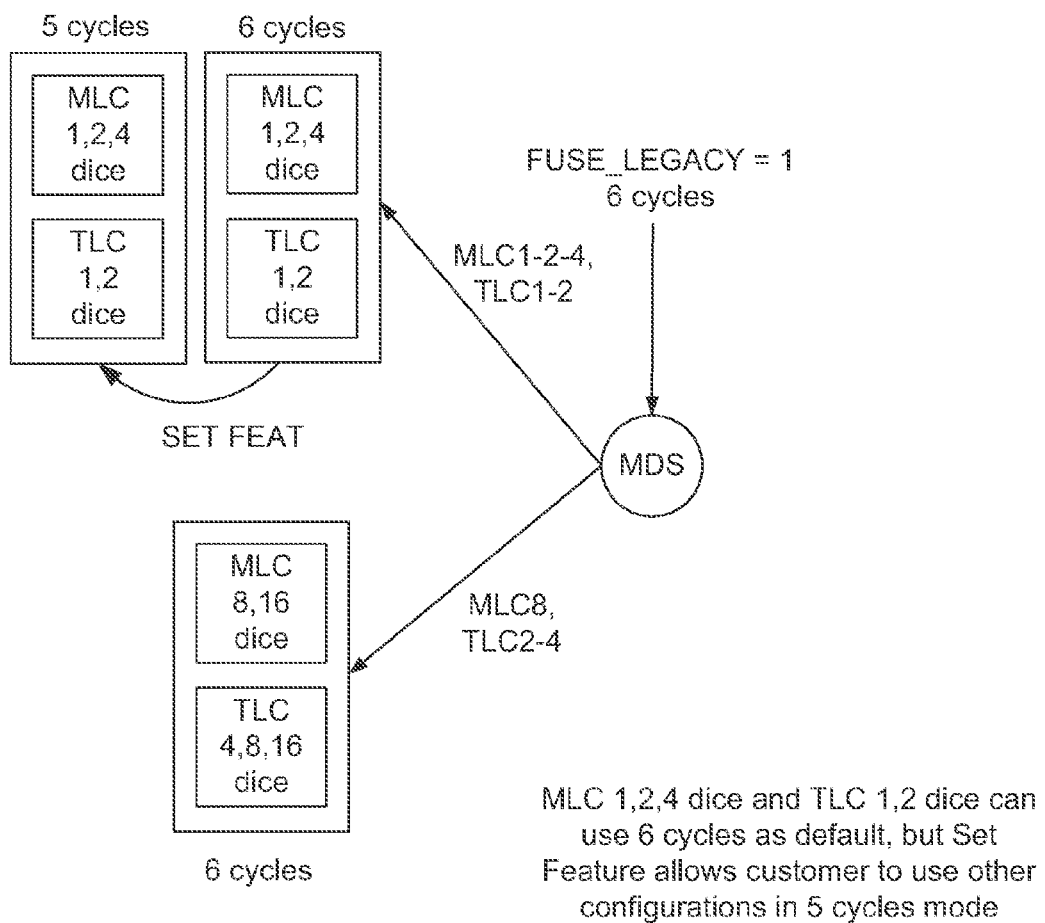
FIG. 2 is another diagram illustrating a defined number of address cycles used to address individual memory units within a NAND memory based on a multilevel cell (MLC) configuration of the NAND memory in accordance with an example embodiment.

FIG. 2 is an exemplary diagram illustrating a default number of address cycles used to address individual memory units within a NAND memory based on a multilevel cell (MLC) configuration of the NAND memory. A memory controller can operate in a six cycle mode (i.e., six address cycles) as default when the NAND memory is operating according to the MLC configuration and one, two or four LUNs are included per target (i.e., chip enable) in the NAND memory. In addition, the memory controller can operate in the six cycle mode as default when the NAND memory is operating according to a three bits per cell (TLC) configuration and one or two LUNs are included per target (i.e., chip enable) in the NAND memory.

In one example, the memory controller can operate using five address cycles. The NAND memory can be reconfigured (via a fuse on the NAND memory) to support the five address cycles that are used at the memory controller. Therefore, the memory controller can use five cycles when the NAND memory is operating according to the MLC configuration and one, two or four LUNs are included per chip enable in the NAND memory. In addition, the memory controller can use five cycles when the NAND memory is operating according to the TLC configuration and one or two LUNs are included per chip enable in the NAND memory.

In one example, the memory controller can operate in a six cycle mode (i.e., six address cycles) as default when the NAND memory is operating according to the MLC configuration and at least eight LUNs (e.g., 8 or 16 LUNs) are included per target (i.e., chip enable) in the NAND memory. In addition, the memory controller can operate in the six cycle mode as default when the NAND memory is operating according to the TLC configuration and four, eight or sixteen LUNs are included per target (i.e., chip enable) in the NAND memory.

FIG. 3 is an exemplary table illustrating multi die select (MDS) mapping values for up to four memory units per chip enable in a NAND memory. A package in the NAND memory can include a single die (or LUN), two dies or four dies. For example, a first package can include Die0, (i.e., the first package can include a single die). A second package can include Die0 and Die1. A third package can include Die0, Die1, Die2 and Die3. Each package can have one chip enable (CE#), or both a first chip enable (CE#) and a second chip enable (CE2#). Each die in each package can be associated with four MDS pads, (e.g., MDS3, MDS2, MDS1 and MDS0). The values for each of the MDS paths can be 0 or 1 depending on whether a particular path is bonded to ground or Vcc. Therefore, each die can be represented by a unique 4-digit binary value. In addition, each die can have one or more LUN-select bits (i.e., LA0 or LA1). The LUN-select bits can be set to 0 or 1. As previously explained, the 4-digit binary value associated with each die in a package within the NAND memory can provide a unique address that can be used to select that particular die and perform read, write or erase operations with that particular die. The 4-digit binary value can vary depending on whether the package has one chip enable or two chip enables. When four dies in the same package share the same chip enable, there can be four combinations of MDS in order to distinguish a particular die out of the four dies in the package.

FIG. 4 is an exemplary table illustrating multi die select (MDS) mapping values for up to eight memory units per chip enable in a NAND memory. A package in the NAND memory can include eight dies (i.e., Die0 to Die7). Each package can have one chip enable (CE#), or both a first chip enable (CE#) and a second chip enable (CE2#). Each die in each package can be associated with four MDS paths, (e.g., MDS3, MDS2, MDS1 and MDS0). The values for each of the MDS paths can be 0 or 1 depending on whether a particular path is bonded to ground or Vcc. Therefore, each die can be represented by a unique 4-digit binary value. In addition, each die can have one or more LUN-select bits (i.e., LA0 or LA1 or LA2). The LUN-select bits can be set to 0 or 1. As previously explained, the 4-digit binary value associated with each die in a package within the NAND memory can provide a unique address that can be used for performing read, write or erase operations with that particular die. The 4-digit binary value can vary depending on whether the package has one chip enable or two chip enables.

Figure 5:
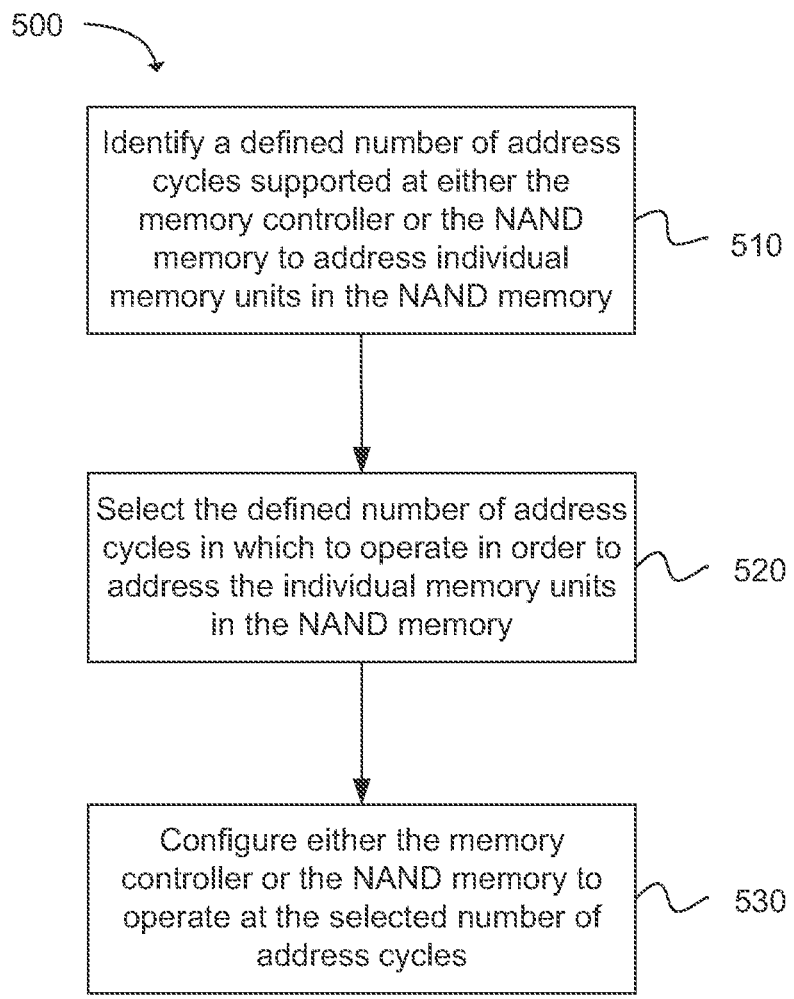
FIG. 5 depicts functionality of circuitry of a memory controller operable to perform addressing in a NAND memory in accordance with an example embodiment.

Another example provides functionality 500 of circuitry of a memory controller operable to perform addressing in a NAND memory, as shown in the flow chart in FIG. 5. The functionality can be implemented as a method or the functionality can be executed as instructions on a machine, where the instructions are included on at least one computer readable medium or one non-transitory machine readable storage medium. The memory controller can be configured to identify a defined number of address cycles supported at either the memory controller or the NAND memory to address individual memory units in the NAND memory, as in block 510. The memory controller can be configured to select the defined number of address cycles in which to operate in order to address the individual memory units in the NAND memory, as in block 520. The memory controller can be configured to configure either the memory controller or the NAND memory to operate at the selected number of address cycles, as in block 530.

In one example, the defined number of address cycles supported at the memory controller is five address cycles or six address cycles. In another example, the defined number of address cycles supported at the NAND memory is five address cycles or six address cycles. In yet another example, the memory controller can be further configured to modify a switching element in the NAND memory when configuring the NAND memory to operate at the selected number of address cycles.

In one configuration, the NAND memory is capable of switching from five address cycles to six address cycles, via the switching element, when the defined number of address cycles supported at the memory controller is six address cycles; or the NAND memory is capable of switching from six address cycles to five address cycles, via the switching element, when the defined number of address cycles supported at the memory controller is five address cycles. In another configuration, the defined number of address cycles supported at the NAND memory is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

In one example, the memory controller can be further configured to address the individual memory units in the NAND memory using a multi die select (MDS), wherein each individual memory unit is addressable using a unique address that is generated based on a number of chip enables in the NAND memory and a number of memory units per chip enable. In another example, the memory controller can be further configured to address the individual memory units in the NAND memory in order to perform at least one of: a read operation, a write operation or an erase operation.

In one configuration, the memory units in the NAND memory are one of: dies, logical unit number (LUNs) or chips. In another configuration, the NAND memory is at least 256 gigabits (Gb) in size. In yet another configuration, the address cycles for addressing the individual memory units in the NAND memory are included in a series of setup commands that are communicated from the memory controller to the NAND memory. In one example, the defined number of address cycles are used to address a column, a page, a block, a plane and a logical unit number (LUN) in the NAND memory. In addition, each address cycle provides up to 8 bits for addressing the individual memory units in the NAND memory.

Figure 6A:
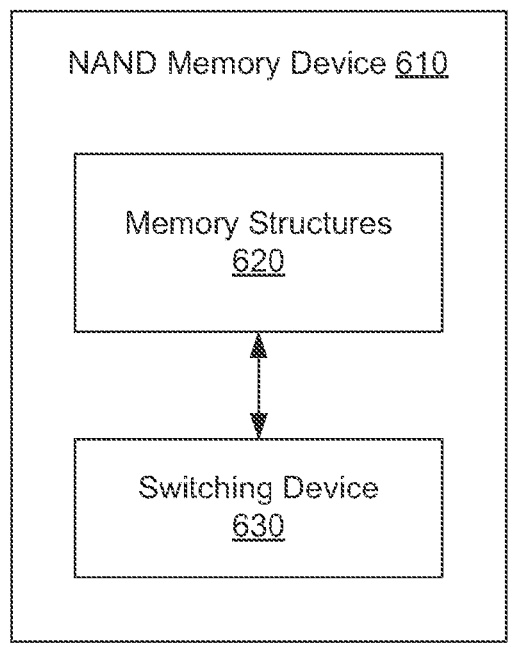
FIG. 6A is a block diagram of a NAND memory device including memory structures and a switching device in accordance with an example embodiment.

An exemplary embodiment as shown in FIG. 6A provides functionality of a NAND memory device 610. The functionality can be implemented as a method or the functionality can be executed as instructions on a machine, where the instructions are included on at least one computer readable medium or one non-transitory machine readable storage medium. The NAND memory device 610 can include a plurality of memory structures 620 and a switching device 630. The plurality of memory structures 620 can be configured to operate at a predetermined number of addressing cycles. The switching device 630 can have a first configuration allowing the memory structures 620 to operate at the predetermined number of addressing cycles and a second configuration allowing the memory structures 620 to operate at a number of addressing cycles that is different from the predetermined number of addressing cycles. In one example, the predetermined number of addressing cycles in the first configuration is five address cycles or six address cycles. In another example, the memory structures 620 operate according to the second configuration in order to correspond with a capability of a memory controller that is communicating with the NAND memory device 610.

Figure 6B:
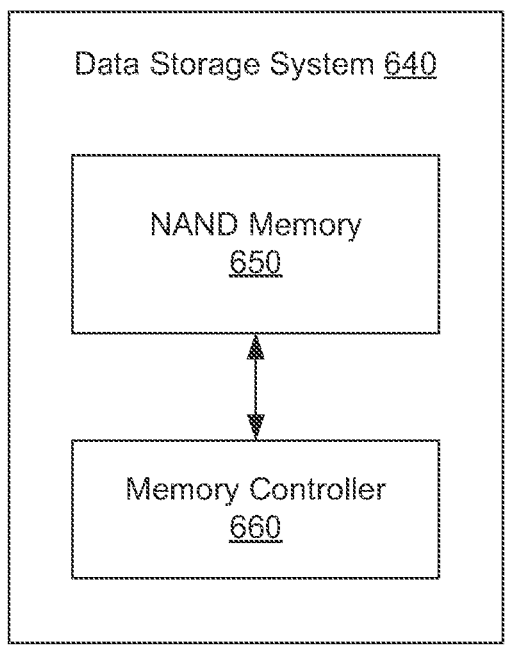
FIG. 6B is a block diagram of a data storage system including a NAND memory and a memory controller in accordance with an example embodiment.

An exemplary embodiment as shown in FIG. 6B provides functionality of a data storage system 640. The functionality can be implemented as a method or the functionality can be executed as instructions on a machine, where the instructions are included on at least one computer readable medium or one non-transitory machine readable storage medium. The data storage system 640 can include a NAND memory 650 and a memory controller 660. The NAND memory 650 can include an array of NAND memory units. The memory controller 660 can be configured to: identify a defined number of address cycles supported at either the memory controller 660 or the NAND memory 650 to address individual memory units in the NAND memory 650; select the defined number of address cycles in which to operate in order to address the individual memory units in the NAND memory 650; and configure either the memory controller 660 or the NAND memory 650 to operate at the selected number of address cycles, wherein the individual memory units in the NAND memory 650 are uniquely addressable using a multi die select (MDS).

In one example, the defined number of address cycles supported at the memory controller is five address cycles or six address cycles. In another example, the defined number of address cycles supported at the NAND memory is five address cycles or six address cycles. In yet another example, the memory controller is further configured to modify a switching element in the NAND memory when configuring the NAND memory to operate at the selected number of address cycles. In addition, the defined number of address cycles supported at the NAND memory is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

Figure 7:
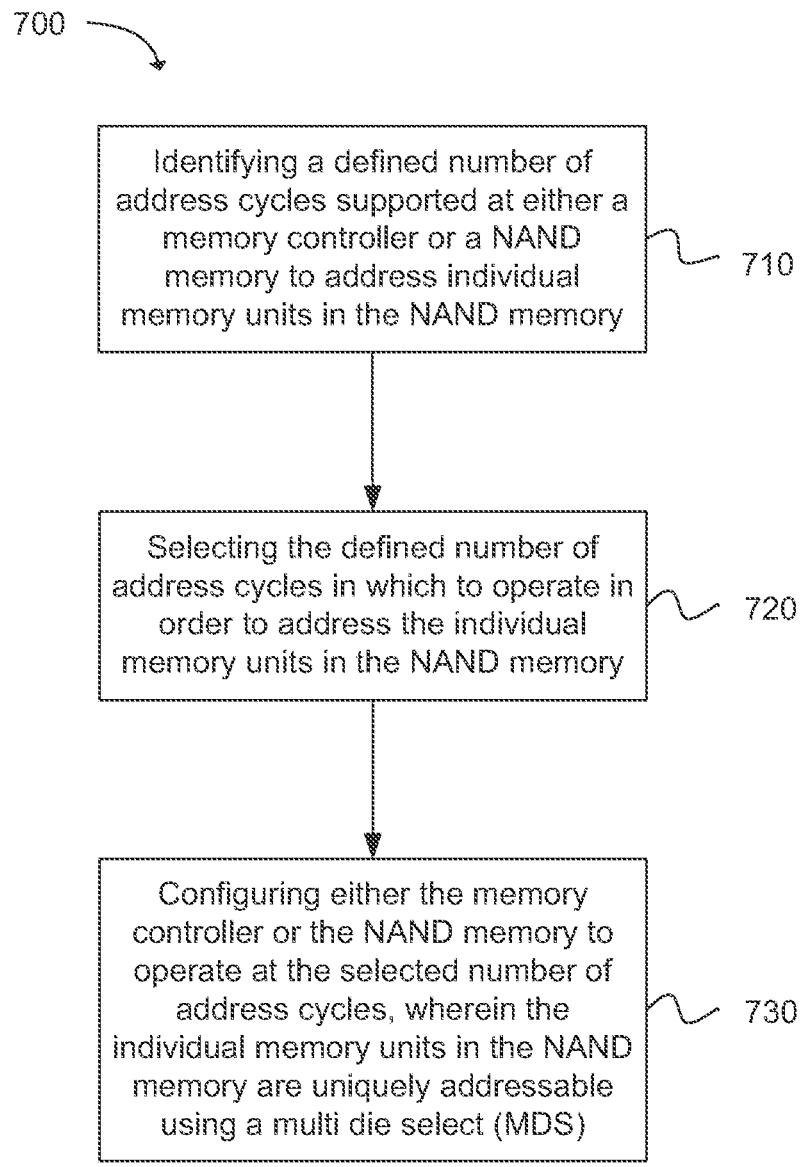
FIG. 7 depicts a flowchart of a method for performing addressing in a NAND memory in accordance with an example embodiment.

Another example provides a method 700 for performing addressing in a NAND memory, as shown in the flow chart in FIG. 7. The method can be executed as instructions on a machine, where the instructions are included on at least one computer readable medium or one non-transitory machine readable storage medium. The method can include the operation of identifying a defined number of address cycles supported at either a memory controller or a NAND memory to address individual memory units in the NAND memory, as in block 710. The method can include the operation of selecting the defined number of address cycles in which to operate in order to address the individual memory units in the NAND memory, as in block 720. The method can include the operation of configuring either the memory controller or the NAND memory to operate at the selected number of address cycles, wherein the individual memory units in the NAND memory are uniquely addressable using a multi die select (MDS), as in block 730.

In one example, the defined number of address cycles supported at the memory controller is five address cycles or six address cycles. In another example, the defined number of address cycles supported at the NAND memory is five address cycles or six address cycles. In addition, the method further includes the operation of modifying a switching element in the NAND memory when configuring the NAND memory to operate at the selected number of address cycles.

Figure 8:
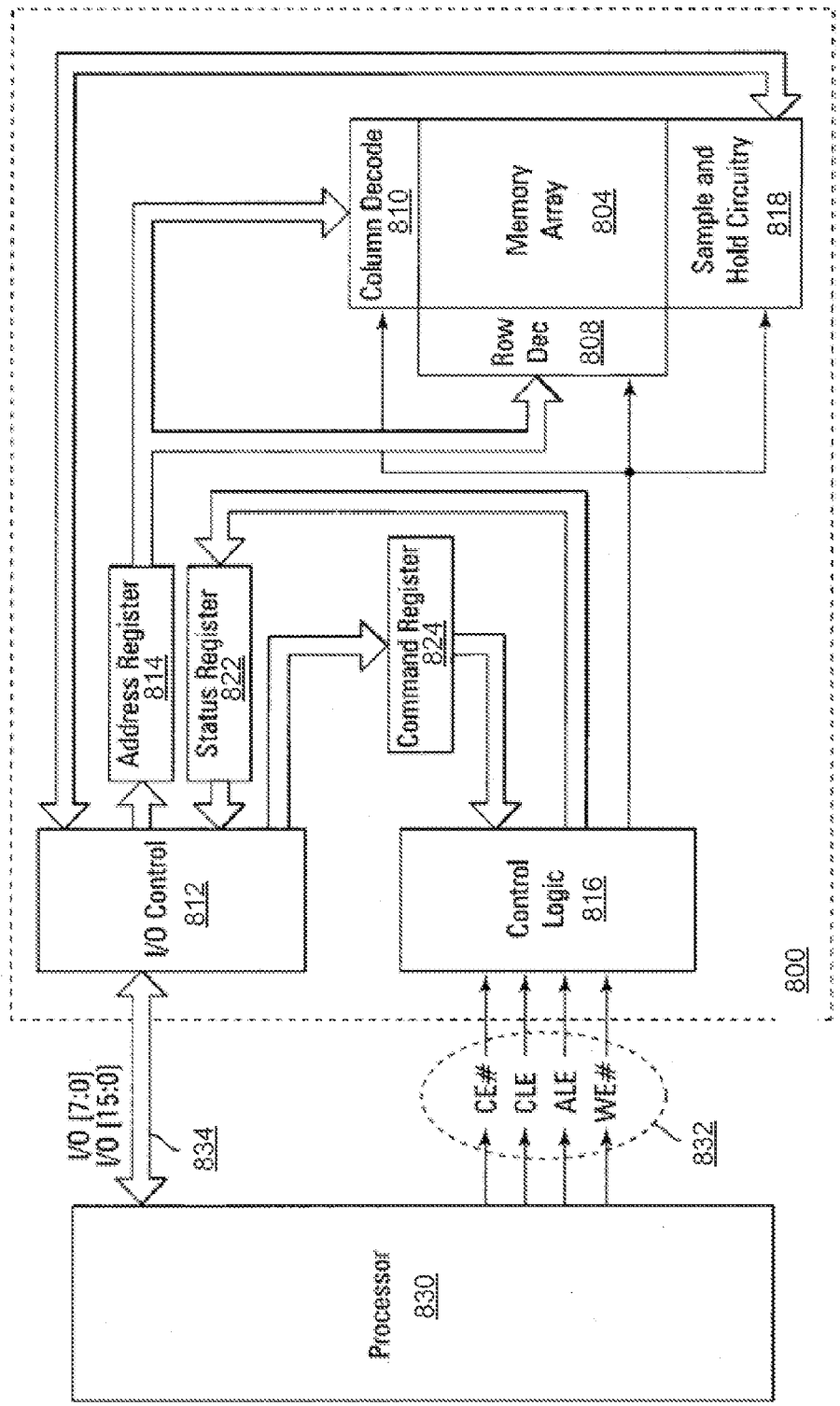
FIG. 8 illustrates a memory system diagram in accordance with an example embodiment.

FIG. 8 is a simplified block diagram of a memory device 800 according to an invention embodiment, and on which various methods can be practiced. Memory device 800 includes an array of memory cells 804 arranged in rows and columns. Although the various embodiments will be described primarily with reference to NAND memory arrays, the various embodiments are not limited to a specific architecture of the memory array 804. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 808 and a column decode circuitry 810 are provided to decode address signals provided to the memory device 800. Address signals are received and decoded to access memory array 804. Memory device 800 also includes input/output (I/O) control circuitry 812 to manage input of commands, addresses and data to the memory device 800 as well as output of data and status information from the memory device 800. An address register 814 is coupled between I/O control circuitry 812 and row decode circuitry 808 and column decode circuitry 810 to latch the address signals prior to decoding. A command register 824 is coupled between I/O control circuitry 812 and control logic 816 to latch incoming commands. Control logic 816 controls access to the memory array 804 in response to the commands and generates status information for an external processor 830 (also known as a memory controller as described earlier). The control logic 816 is coupled to row decode circuitry 808 and column decode circuitry 810 to control the row decode circuitry 808 and column decode circuitry 810 in response to the addresses.

Control logic 816 can be coupled to a sample and hold circuitry 818. The sample and hold circuitry 818 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 818 can further provide for amplification and/or buffering of the sampled signal to provide a stronger data signal to an external device.

The handling of analog data signals can take an approach where charge levels generated are stored on capacitors. A charge can be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 812 for output from the memory device, in the case of a read operation, or used for comparison during one or more verify operations in programming the memory device. It is noted that the I/O control circuitry 812 could optionally include analog-to-digital conversion functionality and digital-to-analog conversion (DAC) functionality to convert read data from an analog data signal to a digital bit pattern and to convert write data from a digital bit pattern to an analog signal such that the memory device 800 could be adapted for communication with either an analog or digital data interface.

During a programming operation, target memory cells of the memory array 804 are programmed until voltages indicative of their Vt levels match the levels held in the sample and hold circuitry 818. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 818 for transfer to an external processor (not shown in FIG. 8) either directly as analog signals or as digitized representations of the analog signals depending upon whether ADC/DAC functionality is provided external to, or within, the memory device.

Threshold voltages of cells can be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 818 can include caching, i.e., multiple storage locations for each data value, such that the memory device 800 can be reading a next data value while passing a first data value to the external processor, or receiving a next data value while writing a first data value to the memory array 804. A status register 822 is coupled between I/O control circuitry 812 and control logic 816 to latch the status information for output to the external processor.

Memory device 800 receives control signals at control logic 816 over a control link 832. The control signals can include a chip enable CE#, a command latch enable CLE, an address latch enable ALE, and a write enable WE#. Memory device 800 can receive commands (in the form of command signals), addresses (in the form of address signals), and data (in the form of data signals) from an external processor over a multiplexed input/output (I/O) bus 834 and output data to the external processor over I/O bus 834.

In a specific example, commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data can be received over input/output (I/O) pins [7:0] for a device capable of receiving eight parallel signals, or input/output (I/O) pins [15:0] for a device capable of receiving sixteen parallel signals, at I/O control circuitry 812 and are transferred to sample and hold circuitry 818. Data also can be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 8 has been simplified to help focus on the embodiments of the disclosure.

While FIG. 8 has been described with respect to sample and hold circuitry 818, it should be understood that the control logic 816 could be coupled to data latches instead of sample and hold circuitry 818 without departing from the scope of the disclosure. Data latches latch data, either incoming or outgoing. During a write operation, target memory cells of the memory array 804 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 8 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 834. Because the data signals represent bit patterns instead of individual bits, serial communication of an 8-bit data signal could be as efficient as parallel communication of eight signals representing individual bits.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, optical drive, magnetic hard drive, solid state drive, or other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

The following examples pertain to further embodiments.

In one embodiment there is provided a memory controller operable to perform addressing in a NAND memory, the memory controller having circuitry configured to:

identify a defined number of address cycles supported at either the memory controller or the NAND memory to address individual memory units in the NAND memory;

select the defined number of address cycles in which to operate in order to address the individual memory units in the NAND memory; and configure either the memory controller or the NAND memory to operate at the selected number of address cycles.

In one embodiment, the defined number of address cycles supported at the memory controller is five address cycles or six address cycles.

In one embodiment, the defined number of address cycles supported at the NAND memory is five address cycles or six address cycles.

In one embodiment, the controller is further configured to modify a switching element in the NAND memory when configuring the NAND memory to operate at the selected number of address cycles.

In one embodiment, the NAND memory is capable of switching from five address cycles to six address cycles, via the switching element, when the defined number of address cycles supported at the memory controller is six address cycles; or the NAND memory is capable of switching from six address cycles to five address cycles, via the switching element, when the defined number of address cycles supported at the memory controller is five address cycles.

In one embodiment, the defined number of address cycles supported at the NAND memory is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

In one embodiment, the controller is further configured to address the individual memory units in the NAND memory using a multi die select (MDS), wherein each individual memory unit is addressable using a unique address that is generated based on a number of chip enables in the NAND memory and a number of memory units per chip enable.

In one embodiment, the controller is further configured to address the individual memory units in the NAND memory in order to perform at least one of: a read operation, a write operation or an erase operation.

In one embodiment, the memory units in the NAND memory are one of: dies, logical unit number (LUNs) or chips.

In one embodiment, the NAND memory is at least 256 gigabits (Gb) in size.

In one embodiment, the address cycles for addressing the individual memory units in the NAND memory are included in a series of setup commands that are communicated from the memory controller to the NAND memory.

In one embodiment, the defined number of address cycles are used to address a column, a page, a block, a plane and a logical unit number (LUN) in the NAND memory.

In one embodiment, each address cycle provides up to 8 bits for addressing the individual memory units in the NAND memory.

In one embodiment, there is provided a NAND memory device comprising:

a plurality of memory structures configured to operate at a predetermined number of addressing cycles; and a switching device having a first configuration allowing the memory structures to operate at the predetermined number of addressing cycles and a second configuration allowing the memory structures to operate at a number of addressing cycles that is different from the predetermined number of addressing cycles.

In one embodiment, the predetermined number of addressing cycles in the first configuration is five address cycles or six address cycles.

In one embodiment, the memory structures operate according to the second configuration in order to correspond with a capability of a memory controller that is communicating with the NAND memory device.

In one embodiment the switching element is a fuse.

In one embodiment, the predetermined number of address cycles is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

In one embodiment, the memory structures are one of: dies, logical unit number (LUNs) or chips.

In one embodiment, the memory capacity is at least 256 gigabits (Gb) in size.

In one embodiment, the number of address cycles are used to address a column, a page, a block, a plane and a logical unit number (LUN) in the NAND memory.

In one embodiment, each address cycle provides up to 8 bits for addressing the individual memory units in the NAND memory.

In one embodiment, there is provided a data storage system comprising:
 a NAND memory including an array of NAND memory units; and
 a memory controller configured to:
  identify a defined number of address cycles supported at either the memory controller or the NAND memory to address individual memory units in the NAND select the defined number of address cycles in which to operate in order to address the individual memory units in the NAND memory; and
  configure either the memory controller or the NAND memory to operate at the selected number of address cycles, wherein the individual memory units in the NAND memory are uniquely addressable using a multi die select (MDS).

In one embodiment, the defined number of address cycles supported at the memory controller is five address cycles or six address cycles.

In one embodiment, the defined number of address cycles supported at the NAND memory is five address cycles or six address cycles.

In one embodiment, the memory controller is further configured to modify a switching element in the NAND memory when configuring the NAND memory to operate at the selected number of address cycles.

In one embodiment, the defined number of address cycles supported at the NAND memory is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

In one embodiment, there is provided a computer-implemented method for performing addressing in a NAND memory, the method comprising:
 identifying a defined number of address cycles supported at either a memory controller or a NAND memory to address individual memory units in the NAND memory;
 selecting the defined number of address cycles in which to operate in order to address the individual memory units in the NAND memory; and
 configuring either the memory controller or the NAND memory to operate at the selected number of address cycles, wherein the individual memory units in the NAND memory are uniquely addressable using a multi die select (MDS).

In one embodiment, the defined number of address cycles supported at the memory controller is five address cycles or six address cycles.

In one embodiment, the defined number of address cycles supported at the NAND memory is five address cycles or six address cycles.

In one embodiment, the method further comprises modifying a switching element in the NAND memory when configuring the NAND memory to operate at the selected number of address cycles.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory controller operable to perform addressing in a NAND memory, the memory controller having circuitry configured to:
 identify a defined number of address cycles supported at either the memory controller or the NAND memory to address individual memory units in the NAND memory;
 select the defined number of address cycles in which to operate in order to address the individual memory units in the NAND memory;
 configure either the memory controller or the NAND memory to operate at the selected number of address cycles; and
 modify a switching element in the NAND memory when configuring the NAND memory to operate at the selected number of address cycles.

2. The memory controller of claim 1, wherein the defined number of address cycles supported at the memory controller is five address cycles or six address cycles.

3. The memory controller of claim 1, wherein the defined number of address cycles supported at the NAND memory is five address cycles or six address cycles.

4. The memory controller of claim 1, further configured to address the individual memory units in the NAND memory using a multi die select (MDS), wherein each individual memory unit is addressable using a unique address that is generated based on a number of chip enables in the NAND memory and a number of memory units per chip enable.

5. The memory controller of claim 1, further configured to address the individual memory units in the NAND memory in order to perform at least one of: a read operation, a write operation or an erase operation.

6. The memory controller of claim 1, wherein the address cycles for addressing the individual memory units in the NAND memory are included in a series of setup commands that are communicated from the memory controller to the NAND memory.

7. A NAND memory device comprising:
 a plurality of memory structures configured to operate at a predetermined number of addressing cycles; and
 a switching device having a first configuration allowing the memory structures to operate at the predetermined number of addressing cycles and a second configuration allowing the memory structures to operate at a number of addressing cycles that is different from the predetermined number of addressing cycles.

8. The NAND memory device of claim 7, wherein the predetermined number of addressing cycles in the first configuration is five address cycles or six address cycles.

9. The NAND memory device of claim 7, wherein the memory structures operate according to the second configuration in order to correspond with a capability of a memory controller that is communicating with the NAND memory device.

10. The NAND memory device of claim 7, wherein the switching element is a fuse.

11. The NAND memory device of claim 7, wherein the predetermined number of address cycles is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

12. The NAND memory device of claim 7, wherein the memory structures are one of:
dies, logical unit number (LUNs) or chips.

13. The NAND memory device of claim 7, wherein the memory capacity is at least 256 gigabits (Gb) in size.

14. The NAND memory device of claim 7, wherein the number of address cycles are used to address a column, a page, a block, a plane and a logical unit number (LUN) in the NAND memory.

15. The NAND memory of claim 7, wherein each address cycle provides up to 8 bits for addressing the individual memory units in the NAND memory.

16. A data storage system comprising:
a NAND memory including an array of NAND memory units and a switching element; and
a memory controller configured to:
identify a defined number of address cycles supported at either the memory controller or the NAND memory to address individual memory units in the NAND memory;
select the defined number of address cycles in which to operate in order to address the individual memory units in the NAND memory; and
configure either the memory controller or the NAND memory to operate at the selected number of address cycles, wherein the individual memory units in the NAND memory are uniquely addressable using a multi die select (MDS); and
modify the switching element in the NAND memory when configuring the NAND memory to operate at the selected number of address cycles.

17. The data storage system of claim 16, wherein the defined number of address cycles supported at the memory controller is five address cycles or six address cycles.

18. The data storage system of claim 16, wherein the defined number of address cycles supported at the NAND memory is five address cycles or six address cycles.

19. The data storage system of claim 16, wherein the defined number of address cycles supported at the NAND memory is based on a density of the NAND memory, wherein the density of the NAND memory refers to a number of memory units per stack in the NAND memory and whether the NAND memory supports single bit per cell (SLC), two bits per cell (MLC), or three bits per cell (TLC).

* * * * *